United States Patent [19]
Urata et al.

[11] Patent Number: 5,152,842
[45] Date of Patent: Oct. 6, 1992

[54] REACTOR FOR EPITAXIAL GROWTH

[75] Inventors: Masafumi Urata, San Jose; Katsuya Shirogaki, Sunnyvale, both of Calif.

[73] Assignees: Rohm Co., Ltd., Kyoto, Japan; Exar Corporation, San Jose, Calif.

[21] Appl. No.: 802,663

[22] Filed: Dec. 5, 1991

[51] Int. Cl.⁵ .............................................. C23C 16/00
[52] U.S. Cl. .................................. 118/725; 118/715; 118/730; 118/500
[58] Field of Search ............... 118/715, 725, 730, 500

[56]         References Cited
U.S. PATENT DOCUMENTS

| | | | |
|---|---|---|---|
| 3,721,210 | 3/1973 | Helms | 118/730 |
| 3,783,822 | 1/1974 | Wollam | 118/730 |
| 3,845,738 | 11/1974 | Berkman | 118/725 |

Primary Examiner—Richard Bueker
Attorney, Agent, or Firm—Armstrong & Kubovcik

[57]              ABSTRACT

A reactor for epitaxial growth wherein a susceptor on which semiconductor wafers are placed is heated by a heater, while rotating around a vertically provided gas feed pipe in a bell jar and a gas introduced through the gas feed pipe into the bell jar is decomposed to deposite a crystalline semiconductor material on the wafers, the susceptor having a plurality of pockets for positioning the wafers in which the pockets are arranged on the uniform temperature region of the susceptor other than the temperature-unstable peripheral portion thereof, thereby preventing production of defective products due to dislocation in crystal growth.

6 Claims, 4 Drawing Sheets

REACTOR FOR EPITAXIAL GROWTH

BACKGROUND OF THE INVENTION

The present invention relates to a reactor for epitaxial growth, and more particularly to a reactor for epitaxial growth wherein the arrangement of silicon wafer-locating pockets formed in a susceptor provided therein is improved.

For epitaxial growth conducted for growing a single crystal of a semiconductor material on a semiconductor substrate such as a silicon wafer, various reactors, e.g. vertical type reactor, horizontal type reactor and barrel type reactor, have been suitably used according to the purposes.

FIG. 4 shows a schematic view of a conventional vertical reactor for epitaxial growth. In the center of bell jar 1 which is made of, for example, quartz glass, a gas inlet nozzle 2 is provided in order to introduce a hydrogen gas and a gas for the growth of semiconductor crystal, e.g. dichlorosilane gas, into the bell jar 1. Susceptor 3 is provided so as to rotate around the gas inlet nozzle 1. Silicon wafers 4 to be subjected to epitaxial growth are placed on the susceptor 3 and heated by induction heating with induction coil 5 provided under the susceptor 3. The used gas is discharged through gas discharge ports 6.

Susceptor 3 used in this vertical reactor has for example a structure as shown in FIGS. 5 and 6. In FIG. 5 showing a plan view of the susceptor, numeral 31 is outer pockets and numeral 32 is inner pockets, and they provide guides for placing wafers 4. Through-hole 33 is provided in the cneter of susceptor 3, through which the gas inlet nozzle 2 is inserted. The diameters of the outer and inner pockets vary depending on the size of the wafers used, and are usually about 100 mm for 4 inch wafer and about 125 mm for 5 inch wafer.

In a conventional epitaxial growth reactor of this type, an induction current is passed through susceptor 3 by induction coil 5 provided as an heater under the susceptor 3, whereby wafers 4 placed on susceptor 3 are heated from the underside of susceptor 3. Susceptor 3 has a tendency to be lower in temperature at its peripheral portion than its inner portion for the reasons that the peripheral portion of susceptor 3 is easy to be exposed to the stream of the introduced gas and that in particular the peripheral portion crosses the gas stream since susceptor 3 rotates around gas inlet nozzle 2 and for other reasons. The temperature distribution of susceptor 3 in the radial direction is shown in FIG. 7. In order to prevent the temperature drop owing to heat radiation at the peripheral portion of susceptor 3, the induction coil 5 is arranged in close proximity to the susceptor at the peripheral portion thereof and at a short distance from the susceptor at the inner portion thereof, whereby the peripheral portion is intensely heated. While heating the susceptor in such a manner, the temperature of the susceptor is measured by a thermometer at six positions in the radial direction, whereby it is contemplated to keep the temperature uniform throughout the entire surface of susceptor 3.

However, even if apparently uniform temperature is achieved throughout the entire surface of susceptor 3 by such a temperature control, defective products may still be produced.

It is a primary object of the present invention to provide a vertical reactor for epitaxial growth which can achieve epitaxial growth in high yields without causing lattice defects.

The above and other objects of the present invention will become apparent from the description hereinafter.

SUMMARY OF THE INVENTION

Even if apparently uniform temperature is achieved throughout the entire surface of susceptor 3 in a manner as conventionally practiced, the repeated drop and rise of temperature produces vigorous fluctuation in temperature of wafers 4 located at that position during the epitaxial growth, though the temperature difference is slight. It has been found that such a vigorous fluctuation in temperature of the wafer during the epitaxial growth is apt to produce a lattice defect, and the production of defective products is caused by slip dislocation which is apt to occur in the peripheral portion of wafers placed in outer pockets 31 of susceptor 3 due to temperature fluctuation.

The slip dislocation as herein referred to is one of lattice deffects which occur in epitaxial growth, and it occurs when some stress is present in a wafer and exceeds a critical point (critical shearing stress). In this case, the primary cause of slip dislocation is considered that a thermal stress generates owing to ununiformity in temperature of the wafer and it produces a strain in the wafer.

As stated above, the temperature of susceptor 3 has hitherto been kept uniform by intensifying the heating at the lower temperature portion while detecting the temperature of susceptor 3 with a thermometer, but it has been found that frequent fluctuations in temperature during epitaxial growth are apt to cause slip dislocation in wafers 4.

In accordance with the present invention, there is provided a reactor for epitaxial growth which comprises a bell jar having a gas inlet nozzle and a gas discharge port, a susceptor for placing semiconductor wafers thereon, and a heater for heating said susceptor provided under said susceptor, said susceptor being rotatably provided around said gas inlet nozzle in said bell jar and having on its upper surface a plurality of pockets for semiconductor wafer location arranged so as to partly overlap the adjacent pocket.

In the epitaxial growth reactor of the present invention, dents for guiding the placement of semiconductor wafers, namely pockets which position the wafers on the susceptor, are formed in the upper surface of the susceptor in such an arrangement that each pocket partly overlaps the adjacent pocket so that the pockets are present within a region of a predetermined radius from the center of susceptor, namely within a uniform temperature region. Accordingly, since all of the wafers are placed on only the uniform temperature region of the susceptor without being present on the peripheral portion of the susceptor where the temperature tends to lower and is apt to become nonuniform, the epitaxial growth can be achieved in high yields without producing lattice defects.

Also, when the pockets for placing wafers thereon are arranged on the susceptor in such a manner as partly overlapping inner circular pockets with outer circular pockets to bring together toward the inside of the susceptor without changing the size of the susceptor of a conventional or existing reactor, change or modification of the reactor, e.g. a relationship between the susceptor and the heater, is not required at all except for the susceptor. Accordingly, the reactor of the present invention can be produced and operated under the same conditions as a conventional reactor with only a slight modification of the susceptor.

DETAILED DESCRIPTION

Figure 4:
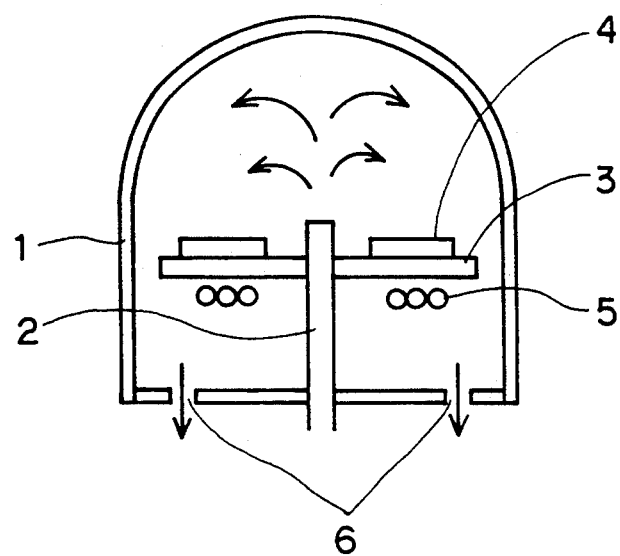
FIG. 4 is a schematic view showing a vertical reactor for epitaxial growth.
Figure 7:
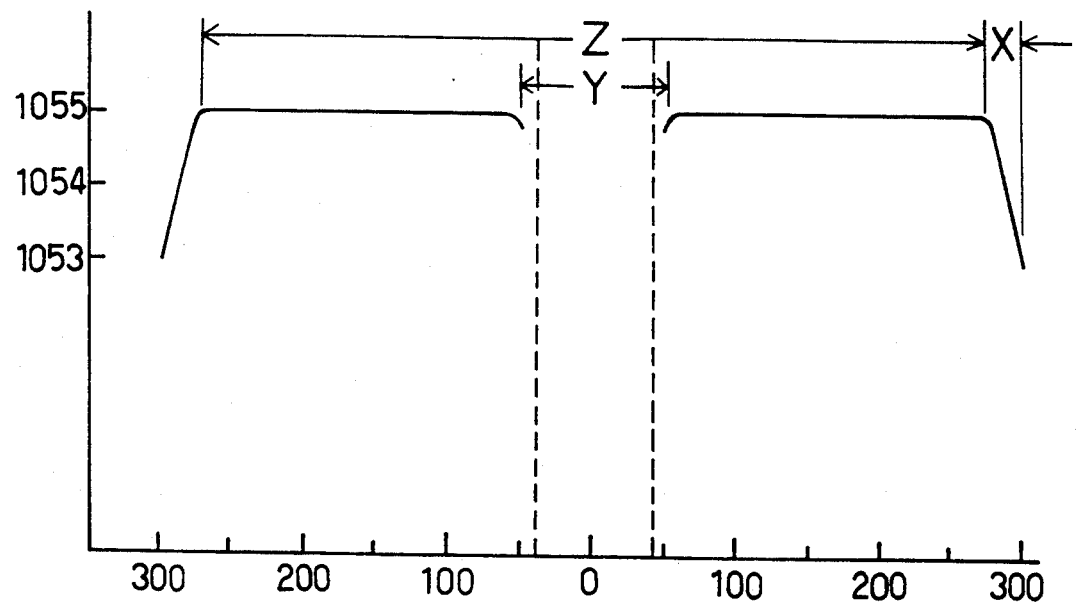
FIG. 7 is a graph showing a temperature distribution of a susceptor at its upper surface in the radial direction during operation of an epitaxial growth reactor.

As a result of investigating the temperature distribution of susceptors in the radial direction, it has been found that susceptors heated in a bell jar show a temperature distribution, as shown in FIG. 7, such that the temperature is substantially constant in the inner portion of the susceptors and sharply drops in the peripheral portion, and that a susceptor having a diameter of 600 mm shows a temperature distribution shown in FIG. 7 wherein the temperature is easy to drop in the region X between the periphery and the about 23 mm inner position from the periphery. Since a circular center portion Y cannot be used owing to arrangement of a gas inlet nozzle, it is necessary to form pockets in the portion Z excepting the center portion Y. The epitaxial growth reactor of the present invention is improved in arrangement of pockets for locating semiconductor wafers to be placed on the susceptor and has substantially the same structure or constitution as that of a conventional epitaxial growth reactor as shown in FIG. 4 except for the pocket arrangement. Accordingly, the structure of the susceptor will be explained below in more detail.

Figure 1:
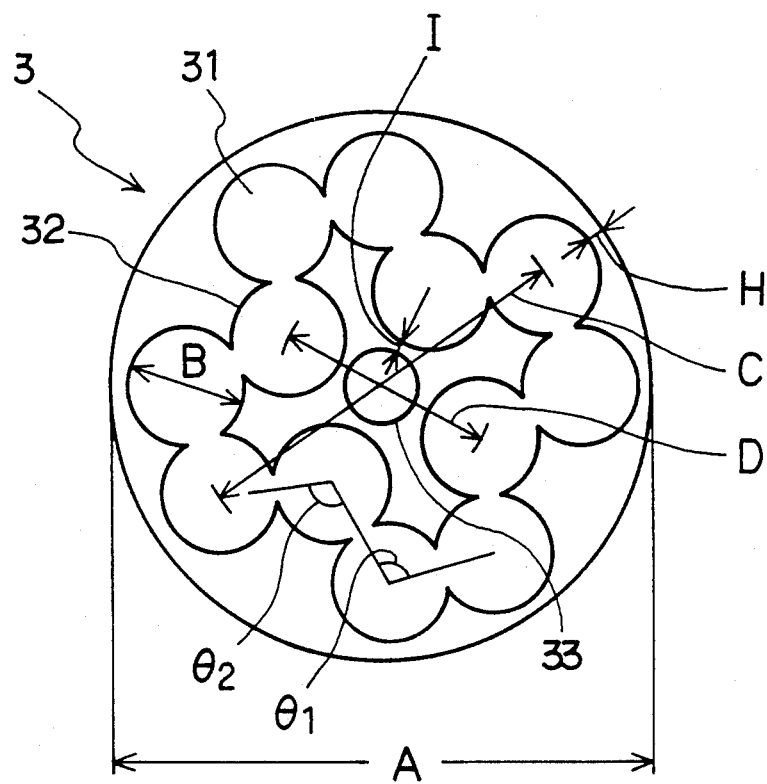
FIG. 1 is a plan view of a susceptor showing an arrangement of pockets which may be used in an embodiment of a reactor for epitaxial growth of the present invention.
Figure 2:
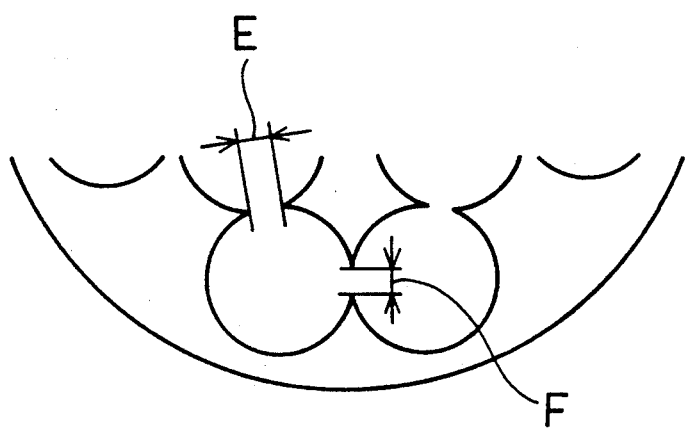
FIG. 2 is an enlarged fragmentary view of the susceptor shown in FIG. 1.

Referring to FIGS. 1 and 2 which show the most preferred embodiment of the susceptor in the present invention, susceptor 3 is for use in epitaxial growth of 5 inch wafers, and is made of carbon so as to be easily heated by induction heating. The susceptor 3 has a diameter A of 600 mm. Outer pockets 31 and inner pockets 32 each having a diameter B of 127 mm are in the form of a circular dent and are provided in the upper surface of susceptor 3. The outer pockets 31 are arranged eight in total so that the centers of eight circular pockets are present on the same circumference of a circle having a diameter C of 427.08 mm concentric with respect to susceptor 3. The inner pockets 32 are arranged four in total so that the centers of four circular pockets are present at equal intervals on the same circumference of a circle having a diameter D of 224.8 mm concentric with respect to susceptor 3. The diameter of through-hole 33 is 82.6 mm. The length of the chord (shown by E in FIG. 2) of the overlapping portion of the outer and inner pockets is 22.1 mm, and the length of the overlapping portion in the radial direction of the circular pocket is about 0.95 mm. Further, the length of the chord (shown by F in FIG. 2) of the overlapping portion of the adjacent two outer pockets is 10 mm, and the length of the overlapping portion in the radial direction of the circular pocket is about 0.2 mm.

The pockets should be arranged so as to allow wafers to be placed therein without wafers placed in the adjacent overlapping pockets being overlapped. In this embodiment, each of the outer and inner pockets 31, 32 has two overlapping portions, and two overlapping portions of the outer pocket 31 appear in the direction of 96° ($\theta_1$ shown in FIG. 1) from the center of the pocket 31 and two overlapping portions of the inner pocket 32 appear in the direction of 103° ($\theta_2$ shown in FIG. 1) from the center of the pocket 32. Therefore, the sum of the length of the two overlapping portions in the radial direction of a pocket does not directly affect the capability of the placement of wafers in the pockets. In this embodiment, the diameter B of each pocket is 127 mm, whereas the diameter G of a 5 inch wafer is usually 125 mm, and accordingly there is an allowance of 2 mm. Moreover, the lengths of overlapping portions in the radial direction of a pocket are about 0.95 mm and about 0.2 mm, as mentioned above. Accordingly, wafers can be placed in the outer and inner pockets 31 and 32 without any trouble. Even if the length of the overlapping portion exceeds 1 mm though it should of course be below 2 mm, wafers can be placed in pockets without being overlapped by placing a wafer in a pocket to bring the wafer close to the opposite side to the overlapping portions of the pocket.

The diameter C of the supposed concentric circle on which the centers of outer pockets 31 are present is 427.08 mm as mentioned above. Since the diameter B of the pocket is 127 mm, the outermost points of the outer pockets 31 locate on a supposed circle having a diameter of 554.08 mm on the susceptor. Accordingly, the distance between the periphery of the susceptor and the outermost point of an outer pocket, as shown by H in FIG. 1, is 22.96 mm [(600−554.08)/2], which is wider than the distance 11.7 mm in a conventional susceptor. This means that the inner and outer pockets 31, 32 are present in the uniform temperature region of the susceptor, as apparent also from FIG. 7 showing the temperature distribution of susceptor in the radial direction. A lattice defect may occur at the outermost position of the uniform temperature region and, therefore, it is effective to place wafers 4 in the outer pockets so that the orientation flat portion 41 of wafer locates at this outermost position.

On the other hand, since gas inlet nozzle 2 is inserted through the center portion of susceptor 3, it should be avoided to arrange inner pockets 32 with unlimitedly bringing them close to the center portion. As apparent from FIG. 7, the temperature of center portion of the susceptor is relatively constant because the heating is made in consideration of heat capacity, but the temperature is easy to drop somewhat owing to gas flow inside the nozzle 2. Accordingly, the temperature of the center portion of susceptor is easy to become non-uniform at the portion near the nozzle 2. It is desirable to arrange inner pockets 32 so as not to bring close to hole 33 for the insertion of nozzle 2. Preferably, the distance I between the innermost point of inner pocket 32 and the periphery of hole 33 is not less than 5 mm, preferably not less than 6.5 mm. In case of the embodiment shown in FIG 1, the distance I is 7.6 mm. Also in this case, it is effective to place wafers 4 in inner pockets 32 with orientation flat portion 41 of the wafer pointing toward the center of susceptor.

In each larger area portion between two sets of the overlapping outer pockets 31, dummy pockets having a diameter permitting the arrangement therein, not shown in FIG. 1, are formed.

As explained above, according to this embodiment, the yield of epitaxial growth can be improved with using a conventionally used vertical reactor for epitaxial growth as it is. That is to say, according to the present invention, a slight modification of a conventional reactor is sufficient, wherein pockets for placing wafers are brought together toward the inside of the susceptor by forming the pockets so as to slightly overlap each other. In the preferred embodiment, the distance H between the outermost end of the pocket and the periphery of the susceptor is set 22.96 mm. This distance 22.96 mm fits the size considered to contribute to improvement in yield that is over 20 mm if it is assumed that the allowable temperature fluctuation of the susceptor is ±0.7° C. based on the measurement of temperature distribution in the radial direction of susceptor. Since the cause that the temperature is apt to drop in the peripheral portion of susceptor is that the introduced gas flows downward through the space between the wall of bell jar and the periphery of susceptor and the susceptor rotates across the gas flow, the desired results can be obtained by arranging pockets on the susceptor within the area excepting the peripheral portion of at least 20 mm in length in the radial direction from the periphery of the susceptor, regardless of the size of the susceptor. Therefore, this fundamental conception is also applicable to other patterns of pocket arrangement than that shown in FIG. 1 and to the production of large-sized epitaxial growth reactors such as a reactor for 6 inch wafers, whereby the decrease of yield in epitaxial growth can be prevented.

Figure 3:
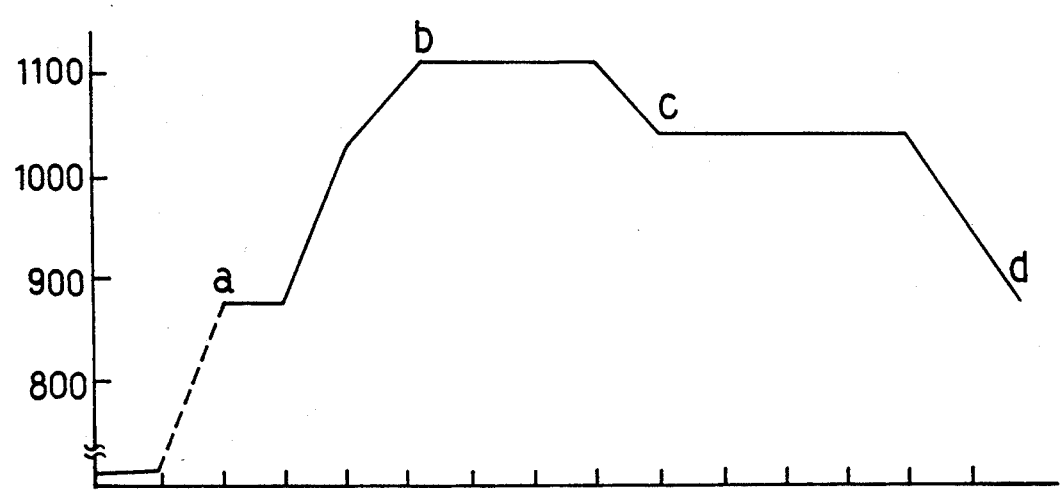
FIG. 3 is a graph showing an instance of a program for carrying out epitaxial growth in an epitaxial growth reactor.

The process for carrying out epitaxial growth of silicon crystal on silicon wafers using the reactor according to the above-mentioned preferred embodiment of the invention will be explained below. A diagram showing a program for epitaxial growth is shown in FIG. 3 wherein the axis of ordinates is optical temperatures and the axis of abscissas is steps.

Firstly, wafers 4 are mounted on susceptor 3, and the susceptor is placed in a reactor. Air in the reactor is replaced with hydrogen gas as a carrier gas, and a high frequency current is caused to flow through an induction coil as a heater to raise the temperature of the susceptor to 880° C. (optical temperature, hereinafter the same) at its surface by eddy current generating in the susceptor (point a shown in FIG. 3). In case of repeatedly carrying out the epitaxial growth, it can be started from the point a after exchanging the susceptor in the reactor with another susceptor carrying fresh wafers.

The current in the coil 5 is then increased to raise the temperature of wafers 4 to 1,120° C. (point b shown in FIG. 3) with rotating susceptor 3 at 7.5 r.p.m. In this condition, hydrogen chloride gas is supplied to the hydrogen gas to introduce the mixed gas into the reactor for about 3 minutes in order to conduct vapor etching of the surface of wafers 4. Thereafter, the supply of hydrogen chloride gas is stopped and the temperature is further kept at 1,120° C. for about 1 minute for after purge.

The temperature is then lowered to 1,055° C. (point c shown in FIG. 3). After keeping the temperature at 1,055° C. for about 3 minutes, the above-mentioned hydrogen gas is mixed with dichlorosilane ($SiH_2Cl_2$) and phosphine ($PH_3$), and the mixed gas of 95.5% of hydrogen, 3.5% of dichlorosilane and 1% of phosphine is introduced to the reactor to effect chemical vapor deposition whereby silicon crystal grows along the crystal axis on the surface of wafers 4. The silicon crystal growth is approximately proportional to the reaction time and, therefore, the reaction is continued for the time corresponding to the desired thickness. Under the above conditions, the deposition rate is 0.55 μm/minute. The above reaction temperature 1,055° C. is set in order to proceed with the reaction as slow as possible. The optimum reaction temperature (growth temperature) is from 1,050° to 1,150° C. when dichlorosilane is used, and the growth rate can be increased by raising the reaction temperature within this range.

Phosphine used in the epitaxial growth is an impurity (dopant) for increasing the electric conductivity of a semiconductor, and an n-type semicondutor crystal grows by contamination with phosphorus impurity. The impurity concentration in a semiconductor can be adjusted at will by increasing or decreasing the proportion of phosphine. Other dopants for giving n-type conductivity, e.g. arsine ($A_5H_3$), can also be used. In case of forming a layer of p-type conductivity, a dopant such as diborane ($B_2H_6$) is introduced to the reactor instead of phosphine, whereby a p-type crystalline silicon layer can be deposited. Also, other silane compounds such as tetrachlorosilane ($SiCl_4$), trichlorosilane ($SiHCl_3$) and monosilane ($SiH_4$) can be used as well as dichlorosilane used as a gas for depositing silicon. In case of using these gases, the preferred deposition temperature is from 1,150° to 1,200° C. for tetrachlorosilane, from 1,100° to 1,150° C. for trichlorosilane, or from 1,000° to 1,100° C. for monosilane, and accordingly the temperature of the reactor at the time of deposition is suitably adjusted according to the gas used.

After forming a silicon layer having a desired thickness, the temperature is further kept at 1,055° C. for about 2 minutes and then lowered to 880° C. (point d shown in FIG. 3). Thus, the epitaxial growth of silicon is completed, and thereafter wafers 4 are taken out together with susceptor 3 to obtain the wafers having epitaxial layer.

Figure 5:
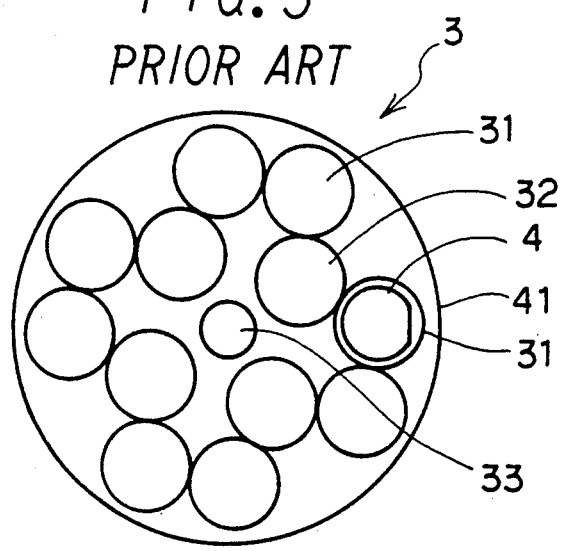
FIG. 5 is a plan view of a susceptor showing a conventional arrangement of pockets.
Figure 6:
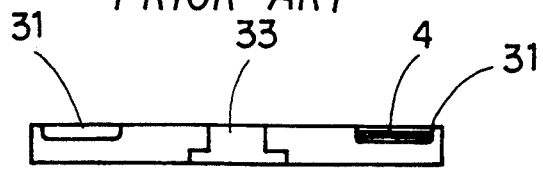
FIG. 6 is a vertical section view of the susceptor shown in FIG. 5.

Twelve sheets of 5 inch wafers were placed on a susceptor having sizes mentioned above with reference to FIG. 1, and various products were prepared by carrying out the epitaxial growth under the conditions mentioned above. The thickness of the epitaxial layer was varied depending on the kind of the products, but was selected from 4.8 to 15.0 μm. The products were formed into chips having a semiconductor circuit, and the electric characteristics thereof were measured to estimate the yield in epitaxial growth using the reactor according to the present invention. The results are shown in Table 1 with the results of the test made in the same manner as above except for the use of a conventional susceptor as shown in FIG. 5.

TABLE 1

| Product No. | Susceptor according to the invention | | Conventional susceptor | |
|---|---|---|---|---|
| | Yield | Number of lots | Yield | Number of lots |
| 1 | 87.02 | 5 | 81.02 | 4 |
| 2 | 96.5 | 4 | 89.32 | 26 |
| 3 | 85.2 | 5 | 72.36 | 6 |

TABLE 1-continued

| Product No. | Susceptor according to the invention | | Conventional susceptor | |
|---|---|---|---|---|
| | Yield | Number of lots | Yield | Number of lots |
| 4 | 83.29 | 21 | 75.28 | 15 |
| 5 | 86.35 | 16 | 79.76 | 8 |
| 6 | 85.15 | 26 | 80.04 | 8 |
| 7 | 94.74 | 2 | 86.4 | 13 |
| 8 | 83.77 | 24 | 77.82 | 16 |
| 9 | 87.67 | 14 | 77.3 | 7 |
| Simple average | 87.74 | — | 79.92 | — |
| Weighted average | 85.63 | — | 81.53 | — |

Since the yield is obtained based on the characteristics of semiconductor chips, the failure of the chips does not always result from a lattice defect which occurred in epitaxial growth, but the comparison with the results of the test conducted under the same conditions using a conventional susceptor would show the advantages of the susceptor according to the present invention. The weighted average yield wherein the number of lots is taken into consideration is improved from 81.53% to 85.63%, and the simple average yield is improved from 79.92% to 87.74%. The improvement in yield is apparent from these results.

In each kind of the products, the number of lots is not the same between the test according to the invention and the test for comparison. For instance, in case of product No. 2, the yield for the conventional susceptor is as high as 89.32%, but the number of lots is also as large as 26. In contrast, the number of lots is as small as 4 in the test using the susceptor according to the invention. Accordingly, it is considered that the weighted average value does not always indicate an exact increase in yield produced by improvement of susceptor, and the simple average value rather exactly indicate the increase in yield produced by improvement of susceptor. The reason is that the yield is estimated based on the test results of electric characteristics of chips and, therefore, the yield is affected by factors resulting from differences in kinds of products, e.g. complexity of circuit. Comparing on the basis of the simple average values, the yield is increased from 79.92% to 87.74%. This 7.82% increase in yield corresponds to about 8.57% decrease in semiconductor cost, thus a marked economical effect is produced.

According to the present invention, occurrence of lattice defect in epitaxial growth can be prevented by merely changing the pockets positions of a susceptor of a conventional vertical reactor for epitaxial growth without changing other conditions of the reactors. Thus, the present invention can remarkably improve the yield of semiconductor products and contributes greatly to lower cost of semiconductor products, in its turn, cost of electronic devices.

The technical concept of the present invention is applicable not only to change of a susceptor of a convnetional existing reactor for epitaxial growth, but also to designing a new reactor for epitaxial growth, and the effects of the present invention are very marked.

While the invention has been particularly described with reference to a preferred embodiment thereof, it is to be understood that various changes and modifications may be made without departing from the spirit and scope of the invention.

What we claim is:

1. A reactor for epitaxial growth which comprises a bell jar having a gas inlet nozzle and a gas discharge port, a susceptor for placing semiconductor wafers thereon, and a heater for heating said susceptor provided under said susceptor, said susceptor being rotatably provided around said gas inlet nozzle in said bell jar and having on its upper surface a plurality of pockets for semiconductor wafer location arranged so as to partly overlap the adjacent pocket.

2. The reactor of claim 1, wherein said plurality of pockets are arranged so that the distance between the periphery of said susceptor and the outermost point of said pockets from the center of said susceptor is not less than 20 mm.

3. The reactor of claim 1, wherein said susceptor is made of carbon.

4. The reactor of claim 1, wherein the length of the overlapping portion of the pockets in the radial direction of the pockets is not more than 0.95 mm.

5. The reactor of claim 1, wherein said susceptor has a diameter of 600 mm and said pockets are arranged on said susceptor so that the outermost end of said pockets is located not more than 277.04 mm apart from the center of said susceptor.

6. The reactor of claim 1, wherein the centers of said plurality of pockets are located on two supposed concentric circles having different diameters with respect to the susceptor, 4 pockets are formed on the circumference of the smaller concentric circle and 8 pockets are formed on the circumference of the larger concentric circle.

* * * * *

UNITED STATES PATENT AND TRADEMARK OFFICE
CERTIFICATE OF CORRECTION

PATENT NO. : 5,152,842

DATED : October 6, 1992

INVENTOR(S) : Masafumi Urata and Katsuya Shirogaki

It is certified that error appears in the above-indentified patent and that said Letters Patent is hereby corrected as shown below:

The drawing sheet , consisting of Figs. 3 and 7, should be deleted to be replaced with the sheet of drawings, consisting of Figs. 3 and 7, as shown on the attached page.

Signed and Sealed this

Twenty-sixth Day of October, 1993

Attest:

BRUCE LEHMAN

Attesting Officer

Commissioner of Patents and Trademarks

UNITED STATES PATENT AND TRADEMARK OFFICE
CERTIFICATE OF CORRECTION

PATENT NO. : 5,152,842
DATED : October 6, 1992
INVENTOR(S) : Masafumi Urata and Katsuya Shirogaki It is certified that error appears in the above-indentified patent and that said Letters Patent is hereby corrected as shown below:

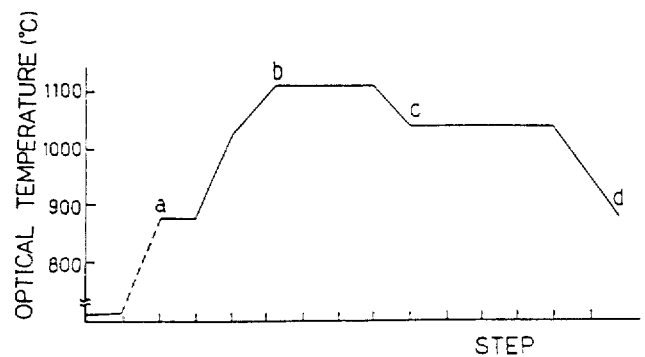

FIG. 3

UNITED STATES PATENT AND TRADEMARK OFFICE
CERTIFICATE OF CORRECTION

PATENT NO. : 5,152,842

DATED : October 6, 1992

INVENTOR(S) : Masafumi Urata and Katsuya Shirogaki

It is certified that error appears in the above-indentified patent and that said Letters Patent is hereby corrected as shown below:

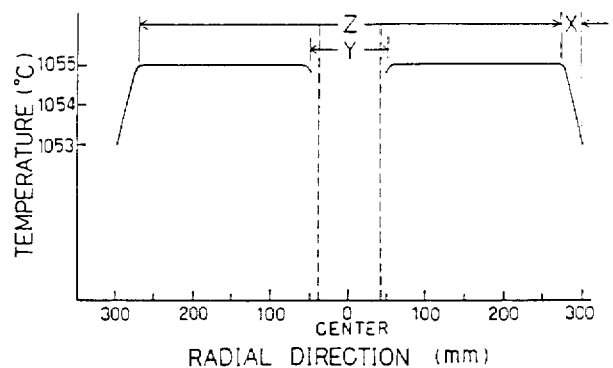

FIG. 7